United States Patent [19]
Wand et al.

[11] Patent Number: 5,200,646
[45] Date of Patent: Apr. 6, 1993

[54] PROTECTION OF SUPPLY METERING

[75] Inventors: Richard Wand, Spalding; Kenneth Payne, Peterborough, both of England

[73] Assignee: Ampy Automation-Digilog Limited, Peterborough, England

[21] Appl. No.: 700,594

[22] Filed: May 15, 1991

[30] Foreign Application Priority Data

May 23, 1990 [GB] United Kingdom ................ 9011531

[51] Int. Cl.⁵ .......................................... H01H 83/00
[52] U.S. Cl. .................................... 307/116; 307/125; 361/111
[58] Field of Search ............... 307/116, 125, 126, 130, 307/131; 371/12, 14; 361/92, 111

[56] References Cited
U.S. PATENT DOCUMENTS 4,072,852 2/1978 Hogan et al. .......................... 371/12
4,752,030 6/1988 Kitamura et al. ..................... 371/12

Primary Examiner—Jeffrey A. Gaffin
Attorney, Agent, or Firm—Lee, Mann, Smith, McWilliams Sweeney & Ohlson

[57] ABSTRACT

The invention relates to an apparatus for protecting electronic circuitry against interfering high voltage discharges, the electronic circuitry being of the nature which controls the operation of a meter. A memory is provided on which a pattern of signals is stored by a watchdog circuit. When an orderly shutdown of the controller occurs, for example due to credit expiry, and when the controller is restored to power, the watchdog circuit reads the memory and generates a shutdown control signal if the stored signal pattern is not preset in the memory.

10 Claims, 3 Drawing Sheets

PROTECTION OF SUPPLY METERING

This invention concerns metered supplies for example of electricity and the protection of the metering used to meter the quantities of electricity or other consumables supplied for example to an end user. In particular the invention is concerned with the protection of such metering devices against fraudulent interference using local high voltage electrical discharges such as piezoelectric gas lighters and static removing devices as used on record players and the like.

BACKGROUND TO THE INVENTION

Electronic circuitry can be seriously affected by high voltage discharges such as produced by piezo electric gas lighters and the like. Historically electricity meters and other supply meters such as water supply meters and the like have not incorporated sensitive electronic circuitry. With the tendency towards more sophisticated metering, remote reading telemetary systems and the like, increasing use is made of sensitive electronic circuitry and if a high voltage discharge occurs in close proximity to such circuitry when the latter is operating, the resulting electrical interference can either cause the circuitry to perform incorrectly and for example switch off or switch on equipment when the reverse condition is in fact required, and in some circumstances may even cause the electronic circuitry to become partially destroyed due to electrical breakdown across sensitive semi-conductor junctions. A breakdown may occur whilst the controlled equipment is in one mode or another and should this occur when the controlled equipment is in its ON mode, the result will be that the controlled equipment may not be capable of being isolated or may be rendered inoperative, or in the case of a supply meter, may be left in the ON condition irrespective of whether prepayment has been made or not.

Unfortunately in practice electrical interference such as caused by lightning or other electrical equipment in proximity with or connected to the equipment containing the sensitive circuitry may also cause similar interference. It is in general impossible to distinguish between one electrical discharge and another which are sufficient to cause interference with sensitive electronic circuits, and clearly the detection of innocent or accidental interference should not penalise a domestic user or other person by, for example, terminating the supply on a semi-permanent basis in the event of any such discharge being detected. The present invention therefore not only deals with the problem of detecting and acting on local electrical interference but also seeks to indicate whether such interference is fraudulent.

SUMMARY OF THE INVENTION

According to the present invention in association with electronic circuitry which controls the operation of a valve or switch to in turn control the supply of a commodity such as electric current and which can be affected by high voltage discharges, there is provided power failure detection means and signal generating means for generating a particular pattern of signals whenever an orderly shutdown is required, due to failure of a supply, deliberate or otherwise or power-down when a prepaid credit expires. Non-volatile memory means is provided in which the particular pattern of signals is stored, and means is provided for reading the memory contents on subsequent power-up. Further signal generating means is provided for generating a control signal if the pattern of signals is not found in the memory thereby to indicate that the previous interruption was not an orderly shutdown.

Power-downs due to interference as described will be referred to as crash power-downs.

The control signal so generated may be added to a running total of similar such control signals and electronic comparison may be effected between the running total and a reference value such that when the latter is for example reached or exceeded, an auto-disconnect circuit is activated so as to render the controlled unit (e.g. valve, switch etc), non-operational.

According to a preferred feature of the invention, where the controlled unit is a prepayment meter for the supply of a commodity such as electricity, and the electronic circuit means includes memory means within which credit data is stored enabling such commodity to be supplied whilst credit remains, the auto-disconnect circuit may additionally be organised so as to decrement any credit remaining in the memory so as to render the unit non-operational until a credit is again entered in the memory (as by entering money into a slot or a machine readable prepayment card into a card reader associated therewith, or by a remote signalling system).

The memory which is employed for storing the said pattern of signals, may also store the purchased credit data and the accumulating number of control signals indicating crash power-downs. Preferably the memory is non volatile memory and is typically an erasable programmable read only memory (EPROM). A battery source or like device may be employed as back-up to ensure that the EPROM (which is basically an active device), is rendered non volatile i.e. does not lose the contents of its memory in the event of a supply failure.

As a further deterrent to interference, the decrementing of credit data stored within the memory may be such as to leave a negative balance within the memory which itself has to be paid off by inserting an appropriate credit (either by way of money or machine readable prepayment credit card or by remote signalling), having sufficient value to pay off not only the negative balance (which for convenience should be displayed) but also to put sufficient credit into the memory to enable the supply of the commodity to be restored.

Conveniently two shut-down procedures may be provided following the detection of an crash power-down. The first normal procedure may be as previously described in which any remaining credit in the memory is decremented to zero (or a negative balance) and the apparatus can be restored to its normal operating condition by the insertion of an appropriate credit either by way of cash or machine readable cards prepurchased for the purpose (or by remote signalling), with or without the need to press a reset control or the like. The second procedure may involve the permanent shutting down of the apparatus so as to prevent it from being restored to normal operation other than by the services of a skilled operator such as an Electricity Board officer, Water Board officer or the like. To this end a running total of all the crash power-downs which occur may be maintained within the memory of the control circuitry and after a predetermined number of such power downs the normal shut-down procedure may be adopted enabling the user to restore the supply of the commodity albeit with a penalty but when the running total reaches a second predetermined number, the second level of shut-down procedure is implemented which is arranged to inhibit the apparatus from further operation and shuts off the supply of the commodity on a semi-permanent basis such that it can only be restored at a later stage.

Since crash power-downs can occur for legitimate reasons albeit at relatively infrequent intervals, a further refinement may be incorporated namely the decrementing of the first running total of crash power-downs to zero after specific intervals of time so as to eliminate from the memory the odd spasmodic crash power-down caused by natural interference symptomatic of electrical installations. The time periods may be irregular so as to eliminate any element of periodicity.

As a further refinement the period over which the first running total is allowed to accumulate control signals arising from crash power-downs before decrementing to zero may be influenced by the number of crash power-downs which have accumulated within the preceding period, and control means may be provided which increases the period during which the number of crash count-downs are counted before decrementing to zero, in the event that the number of crash power-downs occurring during the preceding period is greater than that during the period which preceded the said preceding period. In this way over a period of time the apparatus will set its own period over which crash power-downs are counted before resetting, to take account of the number of crash power downs occurring and thereby rendering the apparatus more sensitive to crash power-downs with time. Whilst this may cause the auto disconnect circuit to come into operation on the odd occasion, when the reason is an innocent one, the user will almost certainly contact the Electricity Board or other commodity provider and complain at the time, enabling an officer of the Board to come and visit and check the installation. If however, the reason for the auto disconnect circuit becoming operational is due to fraudulent interference the Board will probably not be advised of the problem and matters will either revert to normal (i.e. the fraudulent interference will cease) or will continue and the apparatus will continue to become more and more sensitive to fraudulent interference as the length of the period before the preliminary count is decremented to zero is increased, so that there will be an increasing frequency in the operation of the automatic disconnect circuit and recordal of these occurances in the memory within the apparatus so as to provide evidence of the ongoing activity at a later stage.

Conveniently the memory means within the apparatus can be addressed and read either by an officer of the Board or business in charge of the apparatus or by remote sensing.

Preferably the memory means continues to record interference with the control electronics as by local electrical discharges even after the auto disconnect circuit has operated so as to lock out the equipment and require the attendance of a Board officer to restore the supply. In this way evidence of electrical interference as by high voltage electrical discharges in the proximity of the apparatus, will continue to accumulate within the apparatus at a time when a fraudulent user may in fact be attempting to retrigger the apparatus by causing such discharges to occur.

The invention provides memory means which contain at any time an accumulating number equal to the total number of crash power-downs which have occurred and this may be used as evidence of attempted interference should it be needed. Thus apparatus returned to a test room in a lock out condition with a high crash power-down number will present good evidence of attempted fraud. If appropriate, the apparatus could be re-installed after the permanent lock out has been cleared, and left for a period of time in a "clean" environment to demonstrate that crash power-downs do not occur due for example to some fault within the apparatus.

In one embodiment of the invention, a central processor stores in an associated non volatile memory such as an EPROM, a pattern of electrical signals whenever an orderly shut down occurs (that is on power down by the Electricity Board or as a result of failure of the supply which is deliberate or otherwise). On power up, the memory is checked and if the pattern is not there then it is assumed that there must have been a crash such as occurs due to an attack on the equipment arising from a local high voltage electrical discharge as from a gas lighter.

The initial response to an apparent crash condition is to set a report number within a memory unit (typically the same EPROM), to clear any credit and incur for example one day's worth of fixed charge thereby resulting in disconnction until the unit is brought back into credit by inserting prepayment cards or cash of sufficient value. This has a deterrent effect on any repeated interference.

Any subsequent interference using a local electrical discharge will cause a repeat of the above sequence of events with an increase in the debt and the report number.

Conveniently the report number in the memory is always saved in non volatile EPROM but the credit/debit may be saved in random access memory. The report number is secure even if the credit/debit status data is corrupted in severe attacks which can cause it to come up as a high debit value.

The credit or debt status is conveniently saved in the form of a pattern of signals which is very vulnerable to electrical interference, and the apparatus is arranged so that if the pattern becomes corrupted due to electrical interference as by a local electrical discharge, then the default condition is arranged to produce a debt rather than a credit.

In the example being described, after for example the fourth crash power-down the central processor unit is programmed to go into lock out thereby disconnecting the supply with no way out other than by removal of the unit by an engineer for corrective servicing in the laboratory. However, even after lock out, the central processor unit is arranged to continue to record further attacks and to increase the report number up to the maximum capability of the memory.

As previously discussed, since it is impossible to guarantee that over a period of months or years spasmodic crashes will not occur through non fraudulent causes, the report number count may be cleared periodically such as every 24 hours or longer but the apparatus may nevertheless record permanently the total number of crashes which have occurred so as to provide the necessary evidence in the event that it subsequently becomes obvious that the meter has been interfered with, but in such a way as not to accumulate a sufficient number of crash power-down counts in any period of time to produce a permanent lock out condition.

The invention will now be described by way of example, with reference to the accompanying drawings in which.

DETAILED DESCRIPTION OF THE DRAWINGS

Figure 1:
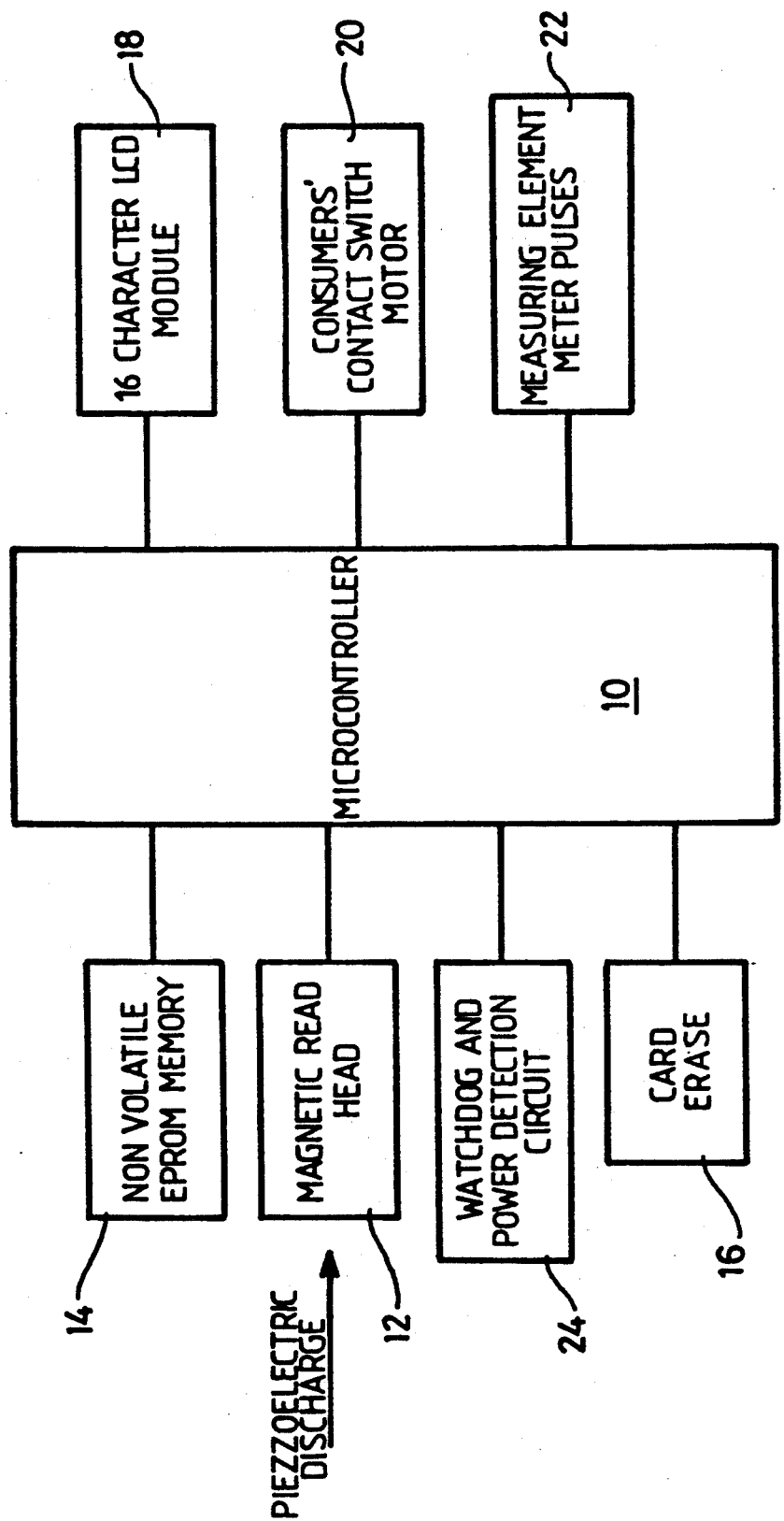
FIG. 1 is a block circuit diagram of a card reading commodity metering system.

In FIG. 1 the apparatus is shown as including a micro-controller or CPU 10 to which signals from a magnetic read head 12 are supplied, the read head forming part of a card reader into which prepaid credit cards are inserted to enter a credit into the micro-controller memory to enable a commodity to be placed on-line available for use by the user. A non volatile EPROM memory 14 is associated with the micro-controller and part of the memory is used for storing data relating to the credit inserted and read by the magnetic read head 12. In addition to the numerical data indicating the number of units of the commodity which has been purchased, a pattern of data may also be stored in the memory or within the random access memory contained within the central processor 10 and in the event of electrical interference, it is most likely that this pattern will be corrupted. Logic circuits (not shown but contained within the microprocessor) determine the status of the pattern and in the event that it has been corrupted indicate immediately that all credit has been used up and that a debit condition exists. The credit data stored in the memory (either in the RAM or the EPROM 14) may itself be cancelled or left intact depending on the logic.

The micro-controller 10 operates other devices associated with the read head so as to erase the data on the card after it has been read to prevent the card from being used a second time. These elements are indicated by reference numeral 16.

A 16 character display unit 18 is also controlled by the central processor unit 10 via suitable drivers which may be incorporated within the central processor unit. The LCD module is arranged to display the credit which has been purchased or the debit which exists or any other information which is to be displayed and conveyed to the user.

Data for driving the LCD module may be stored in the EPROM.

The central processor unit 10 also serves to operate a contactor 20, which may be in the form of an electric motor which acts on and controls a circuit breaker within the controlled apparatus (not shown) so as to open or close the circuit breaker to enable current to be supplied to the user or otherwise.

A pulse counter 22 is responsive to metering pulses supplied by the electricity supply board involved and the count from the pulse counter 22 is supplied to the micro-controller to indicate the usage of electricity. As the increasing pulse count is seen by the micro-controller, so the credit available is decremented until all of the available credit has been exhausted.

In accordance with the invention a watch-dog and power detection circuit 24 is provided which detects the event of a power down i.e. the failure of the supply to the contactor contacts and in that event generates a known pattern of signals which are then stored at the micro-controller in the non volatile EPROM memory 14. When power is again restored to the contactor contacts, the micro-controller first reads the non volatile EPROM memory 14 and if the pattern of signals are present, orderly restoration of power is permitted and no record is made of the power down and stored in the non volatile EPROM memory 14.

If however, the regular pattern of signals is not found in the non volatile memory on power up, the watch-dog power detection circuit 24 causes a record in the form of a report number to be stored in the non volatile EPROM memory and each time this state is determined, this report number is incremented by one and further signals from the watch-dog circuit 24 are utilised to decrement any credit remaining in the non volatile EPROM memory to zero or to a negative value and this is displayed on the LCD module 18 with an invitation for the user to insert a further prepaid credit card to restore the supply.

Figure 2:
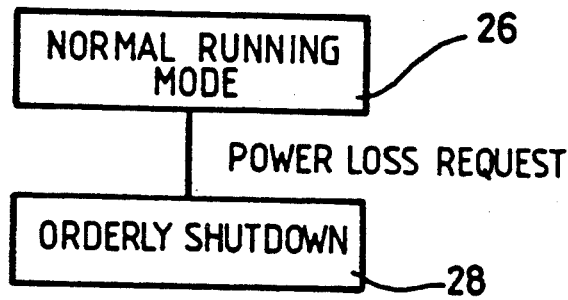
FIG. 2 shows the steps of a valid power down.
Figure 3:
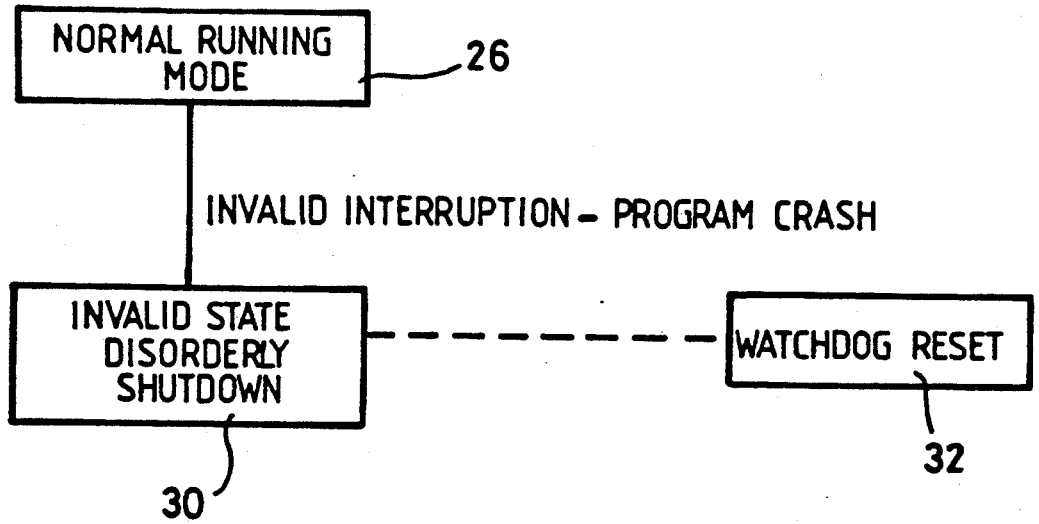
FIG. 3 shows the steps of an invalid power down brought about perhaps by a localised electrical discharge.

The mode of operation is best shown in FIGS. 2 to 5. In FIG. 2 normal running mode is denoted by box 26. If a power loss is noted due to a failure of the electricity supply then orderly shutdown is instructed with the insertion of the known pattern of electrical signals into the non volatile memory 14. In FIG. 3 the normal running mode 26 is interrupted by an invalid interruption such as caused by a localised electrical discharge resulting in a crash signal being generated by the magnetic read head 12. The micro-controller is programmed to immediately switch off the contactor 20 to inhibit the supply of power but since the power down has occurred without the removal of power from the contactor contacts, no pattern of signals is stored in the non volatile EPROM memory 14 and an invalid state is noted by the watch-dog circuit 24 as a result of the disorderly shutdown. This condition is denoted by box 30 in FIG. 3. This causes the watch-dog circuit 24 to be reset (see instruction 32) and causes the report number to be incremented by one in the non volatile EPROM memory 14 when the contactor is enabled and the power is restored.

Restoration of the power may be as a result of an automatic countdown procedure by the micro-controller which will attempt to close the contactor after an interference discharge of this nature or a reset button may be provided on the apparatus which has to be pressed by the user to instigate the power up mode.

Figure 4:
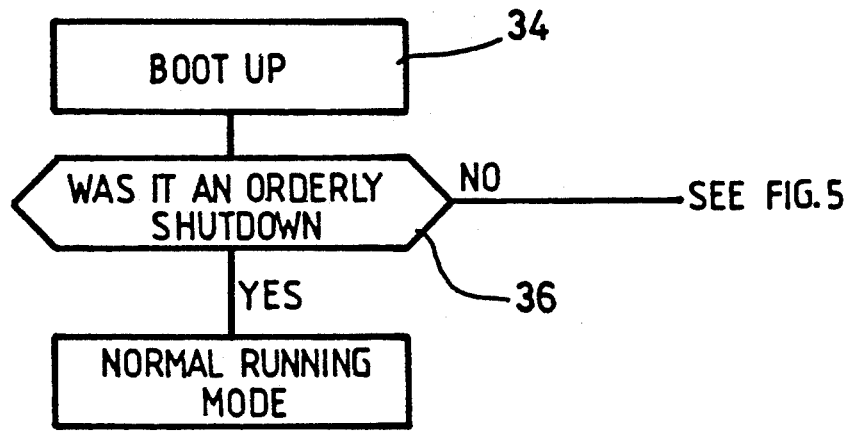
FIG. 4 shows the sequence of events during power up following a valid power down.
Figure 5:
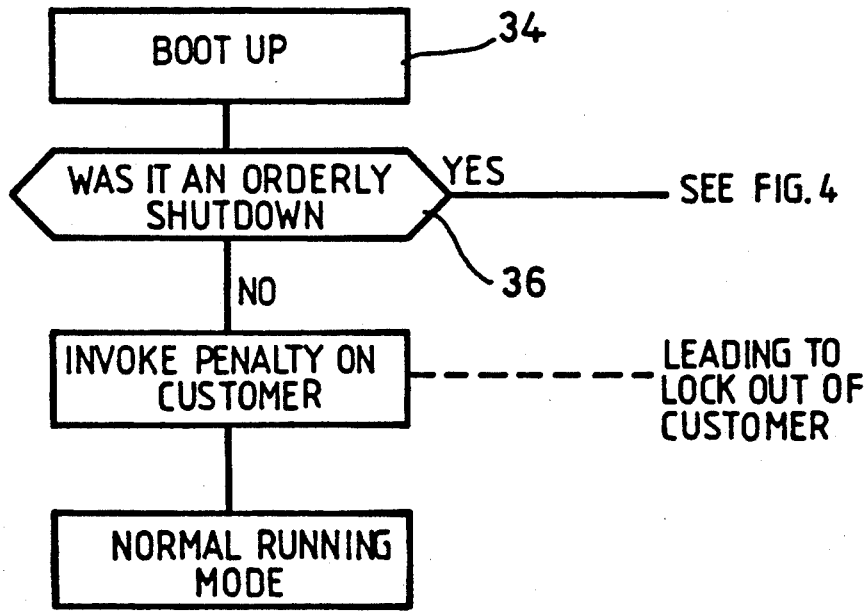
FIG. 5 shows the sequence of events when power up occurs following an invalid power down.

Following power down, the power up sequences are illustrated in FIGS. 4 and 5 following the two possible events.

Thus in FIG. 4 the boot up or power up instruction is denoted by reference numeral 34. The non volatile EPROM memory 14 is consulted to determine if the previous shut down was orderly or disorderly to instigate normal running or envoking customer penalty before normal running mode can be instigated as in FIG. 5.

We claim:

1. In combination with electronic circuitry which controls the operation of a controller to in turn control the supply of a commodity and which can be interfered with by high voltage discharges, protection apparatus comprising power failure detection means and signal generating means for generating a particular pattern of signals whenever an orderly shutdown is required due to failure of a supply (deliberate or otherwise) or due to power-down when a prepaid credit expires, non volatile memory means having a signal memory in which the said particular pattern of signals is stored, means for reading the memory on subsequent power-up and further signal generating means for generating a control signal if the pattern of signals is not found in the memory, thereby to indicate that the previous interruption was not an orderly shutdown but a crash power-down due to interference.

2. Apparatus according to claim 1, including means whereby the control signal is added to a running total of similar such control signals and electronic comparison is effected between the running total and a reference value such that when the reference value is obtained, an auto-disconnect circuit is activated so as to render the controller non-operational.

3. Apparatus according to claim 2, wherein the controller is a prepayment meter for the supply of a commodity, and the associated electronic circuitry includes a credit memory within which credit data is stored to enable such commodity to be supplied whilst credit remains, and wherein the auto-disconnect circuit is arranged to decrement any credit remaining in the memory so as to render the unit non-operational until a credit is again entered in the memory.

4. Apparatus according to claim 3, wherein the signal memory which is employed for storing the said pattern of signals also stores the accumulating number of control signals indicating crash power-downs.

5. Apparatus according to claim 4 wherein, dependent on the stored number of power crash-down, two shut-down procedures are provided following the detection of an crash power-down, namely a first normal procedure in which any remaining credit in the memory is decremented and the controller can be returned to its normal operating condition by the restoration of an appropriate credit, and a second procedure which involves the permanent shutting down of the controller so as to prevent it from being restored to normal operation by the user.

6. Apparatus according to claim 5, in which the signal memory stores a first running total of crash power-downs (control signals) and when such total reaches a predetermined number the normal shut-down procedure is adopted enabling the user to restore the supply of the commodity albeit with a penalty, and the signal memory also stores a second running total of crash power-downs whereby, when the second running total reaches a second predetermined number, the second shut-down procedure is implemented which is arranged to inhibit the controller from further operation and shuts off the supply of the commodity on a semi-permanent basis.

7. Apparatus according to claim 6, including means for decrementing the first running total of crash power-downs to zero after specific periods of time so as to eliminate from the signal memory any spasmodic crash power-downs caused by natural interference symptomatic of electrical installations.

8. Apparatus according to claim 7, including means whereby, the period over which the first running total is allowed to accumulate control signals arising from crash power-downs before decrementing to zero is influenced by the number of crash power-downs which have accumulated within the preceding period, and control means is provided which increases the period during which the number of crash count-downs are counted before decrementing to zero, in the event that the number of crash power-downs occurring during the preceding period is greater than that during the period which preceded the said preceding period.

9. Apparatus according to claim 6 wherein the signal memory within the apparatus can be addressed by remote sensing.

10. Apparatus according to claim 6 wherein the signal memory continues to record crash power-downs after the auto disconnect circuit has operated so as to lock out the equipment.

* * * * *